US011973168B2

(12) United States Patent
Basin et al.

(10) Patent No.: US 11,973,168 B2
(45) Date of Patent: Apr. 30, 2024

(54) CONVERTER WITH GLASS LAYERS

(71) Applicant: LUMILEDS LLC, San Jose, CA (US)

(72) Inventors: Grigoriy Basin, San Francisco, CA (US); Mooi Guan Ng, Fremont, CA (US); Lex Alan Kosowsky, San Jose, CA (US); Phillip Barton, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/122,520

(22) Filed: Mar. 16, 2023

(65) Prior Publication Data

US 2023/0215992 A1    Jul. 6, 2023

Related U.S. Application Data

(62) Division of application No. 16/226,313, filed on Dec. 19, 2018, now Pat. No. 11,637,225.

(60) Provisional application No. 62/608,326, filed on Dec. 20, 2017.

(30) Foreign Application Priority Data

Feb. 20, 2018 (EP) ..................................... 18154855

(51) Int. Cl.
*H01L 33/50* (2010.01)
*C09K 11/02* (2006.01)
*H01L 27/15* (2006.01)
*H01L 33/34* (2010.01)
(Continued)

(52) U.S. Cl.
CPC ............ *H01L 33/504* (2013.01); *C09K 11/02* (2013.01); *H01L 27/156* (2013.01); *H01L 33/346* (2013.01); *H01L 33/501* (2013.01); *H01L 33/502* (2013.01); *H01L 33/505* (2013.01); *H01L 33/56* (2013.01); *H01L 33/60* (2013.01);
(Continued)

(58) Field of Classification Search
CPC ... H01L 33/501; H01L 33/504; H01L 33/502; H01L 2933/0041; H01L 33/346; H01L 33/505; C09K 11/02
See application file for complete search history.

(56) References Cited

U.S. PATENT DOCUMENTS

| 9,685,594 | B2 | 6/2017 | Urano et al. |
| 10,886,440 | B2 | 1/2021 | Moran et al. |
| 10,998,473 | B2 | 5/2021 | Basin et al. |

(Continued)

FOREIGN PATENT DOCUMENTS

| CN | 104953013 A | 9/2015 |
| CN | 204809252 A | 11/2015 |

(Continued)

OTHER PUBLICATIONS

From the International Searching Authority, Notification of Transmittal of the International Search Report and the Written Opinion of the EPO as the ISA, PCT/US2018/066949, dated Feb. 15, 2019, 15 pages.

(Continued)

*Primary Examiner* — Tucker J Wright

(57) ABSTRACT

A wavelength converting layer may have a glass or a silicon porous support structure. The wavelength converting layer may also have a cured portion of wavelength converting particles and a binder laminated onto the porous glass or silicon support structure.

20 Claims, 12 Drawing Sheets

(51) Int. Cl.
*H01L 33/56* (2010.01)
*H01L 33/60* (2010.01)

(52) U.S. Cl.
CPC .... *H01L 33/508* (2013.01); *H01L 2933/0041* (2013.01); *H01L 2933/005* (2013.01)

(56) References Cited

U.S. PATENT DOCUMENTS

| | | | |
|---|---|---|---|
| 11,637,225 | B2 | 4/2023 | Basin et al. |
| 2009/0322205 | A1 | 12/2009 | Lowery |
| 2014/0306244 | A1 | 10/2014 | Draw et al. |
| 2014/0339582 | A1* | 11/2014 | Matsumura ........... H01L 33/005 427/256 |
| 2015/0219290 | A1 | 8/2015 | Hikmet et al. |
| 2016/0300985 | A1 | 10/2016 | Gootz et al. |
| 2017/0114220 | A1* | 4/2017 | Kusunoki ............... C08L 83/06 |
| 2018/0033929 | A1 | 2/2018 | Baike |

FOREIGN PATENT DOCUMENTS

| | | | |
|---|---|---|---|
| CN | 106415863 | A | 2/2017 |
| EP | 2819185 | A1 | 12/2014 |
| JP | 2006-060099 | A | 3/2006 |
| JP | 2006-060100 | A | 3/2006 |
| JP | 2006-282685 | A | 10/2006 |
| JP | 2006282685 | * | 10/2006 ............. C09K 11/08 |
| JP | 2009-084403 | A | 4/2009 |
| JP | 2009-147312 | A | 7/2009 |
| JP | 2017-502524 | A | 1/2017 |
| WO | 2013/179624 | A1 | 12/2013 |

OTHER PUBLICATIONS

The extended European search report corresponding to EP20186985.6, dated Dec. 21, 2020.

* cited by examiner

CONVERTER WITH GLASS LAYERS

CROSS REFERENCE TO RELATED APPLICATIONS

This application is a division of U.S. non-provisional application Ser. No. 16/226,313 filed Dec. 19, 2018, which claims the benefit of U.S. provisional App. No. 62/608,326 filed Dec. 20, 2017 and EP App. No. 18154855.3 filed Feb. 20, 2018; each of said applications is incorporated herein by reference in their entireties.

BACKGROUND

Semiconductor light-emitting devices including light emitting diodes (LEDs), resonant cavity light emitting diodes (RCLEDs), vertical-cavity surface-emitting laser (VCSEL), edge emitting lasers, or the like are desirable due to efficiency, performance, light temperature, brightness, or the like. Materials of interest in the production or manufacture of light emitting devices operating across the visible spectrum may include Group 111-V semiconductors, binary, ternary, and quaternary alloys of gallium, aluminum, indium, nitrogen, III-nitride materials, or the like.

LEDs may be arranged with wavelength converting materials such as phosphor particles, quantum dots, dyes, or the like. AN LED combined with one or more wavelength converting materials may be produced to create white light, monochromatic light of other colors, or the like. The light emitted by the LED may be converted by the wavelength converting material. Unconverted light may be part of a resulting spectrum of light.

An LED may be coated with phosphor that is dispensed, screen printed, sprayed, molded, electrophoretically deposited, laminated, or the like. Although it may be complex and expensive, for high temperature applications, a phosphor contained in glass, or a pre-formed sintered ceramic phosphor may be attached to an LED. In addition, it can be difficult to form or cut thin pre-formed ceramic layers.

SUMMARY

A wavelength converting layer may have a glass or a silicon porous support structure. The wavelength converting layer may also have a cured portion of wavelength converting particles and a binder laminated onto the porous glass or silicon support structure.

BRIEF DESCRIPTION OF THE DRAWINGS

A more detailed understanding may be had from the following description, given by way of example in conjunction with the accompanying drawings, wherein like reference numerals in the figures indicate like elements, and wherein:

FIG. 2C is a diagram showing an LED system with secondary optics;

DETAILED DESCRIPTION

Figure 1A:
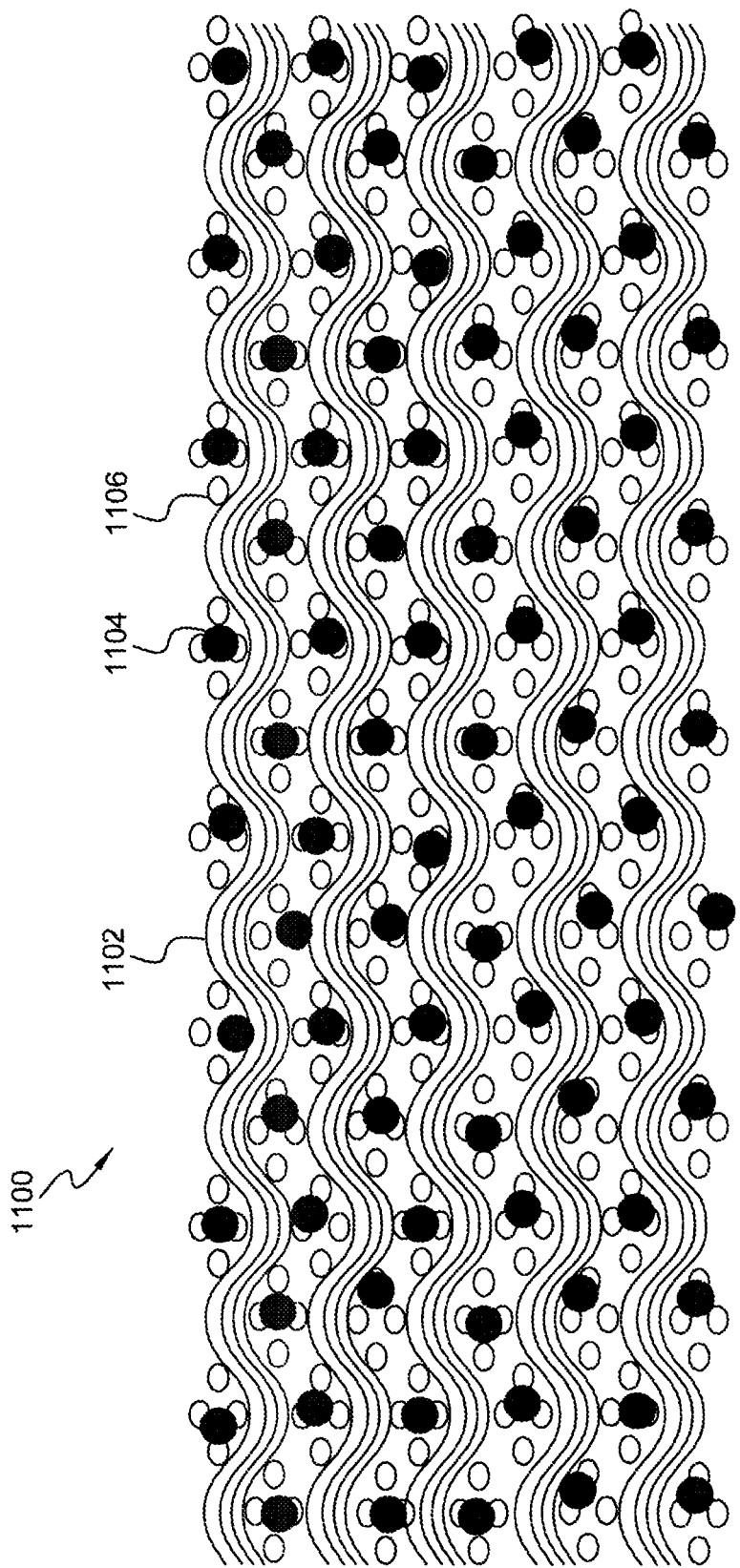
FIG. 1A illustrates a wavelength converting layer with a phosphor comprising a glass mesh.

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available. These devices may include light emitting diodes, resonant cavity light emitting diodes, vertical cavity laser diodes, edge emitting lasers, or the like (hereinafter referred to as "LEDs"). Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

In the example given herein a wavelength converting layer may include a glass (e.g., quartz) or silicon porous support material. The porous support structure may be stacked mesh layers. Certain arrangements may include wavelength converting particles that may be inorganic phosphor particles, have a silicone binder, have silicone with fillers as a binder to increase the refractive index, or the like. A wavelength converting layer may be attached to a light source, light emitting diode (LED), or the like. In the examples given herein of light devices may include a blue-emitting light emitting diode (LED) combined with a yellow-emitting phosphor, a blue-emitting LED combined with green- and red-emitting phosphor particles, a ultraviolet (UV)-emitting LED combined with blue- and yellow-emitting phosphor particles, and a UV-emitting LED combined with blue-, green-, a red-emitting phosphor particles, or the like or a combination thereof.

A stacked mesh layer may be one in which the support material (e.g., glass, silicon, quartz) includes woven fibers or strings that extend over multiple cavities created by the respective woven fibers. As shown in FIG. 1A, the substrates 1102 are woven such that they extend the span of multiple cavities. Further, the substrates 1102 are stacked in a formation that may allow one or more cavities to span across multiple layers of the mesh substrate. A woven material (e.g., glass, silicon, quartz) may be woven such that one end of a piece of the material that is used to create the mesh extends across 100% or substantially 100% of a dimension of the mesh. As an example, a first woven support material may have a first end at a first edge of the stacked mesh and a second edge at a second edge of the stacked mesh such that the first end is on an opposite end of the stacked mesh than the second end.

Phosphor particles utilized in a wavelength converting layer may be dispensed, screen printed, sprayed, molded, electrophoretically deposited, laminated, or the like. In certain applications, processing of phosphor in glass or preformed ceramic phosphor may be costly or be difficult to form or cut thin pre-formed ceramic layers.

FIG. 1A illustrates a wavelength converting layer 1100 with a phosphor comprising a glass mesh. A wavelength converting layer 1100 may be formed from a combination of quartz or glass substrates 1102, phosphor or other light wavelength converting particles 1104, and a binder 1106. A glass substrate may comprise a thin quartz mesh filled with phosphor particles, silicone binders, quartz or glass fillers having a refractive index closely matching the quartz mesh, or the like.

The substrate 1102 may be formed as a mesh, a sheet, utilizing ordered or random fibers arranged in two or three-dimensional patterns, or the like. Multiple homogenous or heterogeneous layers formed from various materials or ordered arrangements can be used. For example, an outermost layer may be a continuous glass or quartz sheet. Mesh spacing, effective pore size, pore fluid connectivity, or the like may be arranged to allow for atmospheric, low, or high-pressure emplacement of phosphor particles and binder material throughout the substrate 1102.

Light wavelength converting particles such as phosphor particles may be luminescent materials that can absorb excitation or radiation energy and emit absorbed energy as radiation of a different wavelength than the excitation wavelength. Phosphor particles for example, may be highly light absorbent and have quantum efficiencies substantially at 100% such that most photons provided as excitation energy are reemitted by the phosphor. If a light emitting device can emit light directly into an efficient, absorbent phosphor, the phosphor may efficiently extract and wavelength convert the emitted light.

Light wavelength converting particles may include organic phospors, quantum dots, organic semiconductors, II-VI or III-V semiconductors, II-VI or III-V semiconductor quantum dots or nanocrystals, dyes, polymers, or luminesce materials, or the like. For example, a white-emitting LED may result from pairing a blue-emitting LED with a wavelength converting material such as Y3Al5O12:Ce3+, that absorbs some of the blue light and emits yellow light. Other examples of phosphor particles that may be used include aluminum garnet phosphor particles with:

(Lu1-x-y-a-bYxGdy)3(Al1-zGaz)5O12:CeaPrb  Formula (1)

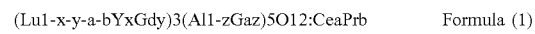

wherein 0<x<1, 0<y<1, 0<z≤0.1, 0<a≤0.2 and 0<b≤0.1 and Lu3Al5O12:Ce3+ and Y3Al5O12:Ce3+ which emit light in the yellow-green range. Another example may be (Sr1-x-yBaxCay)2-zSi5-aAlaN8-aOa:Euz 2+ wherein 0≤a<5, 0<x≤1, 0≤y≤1, and 0<z≤1, such as Sr2Si5N8:Eu2+, which emit light in the red range.

Other suitable green, yellow, and red emitting phosphors may include (Sr1-a bCabBac)SixNyOz:Eua 2+ (a=0.002-0.2, b=0.0-0.25, c=0.0-0.25, x=1.5-2.5, y=1.5-2.5, z=1.5-2.5) including, for example, SrSi2N2O2:Eu2+; (Sr1-u-v-xMguCavBax)(Ga2-y-zAlyInzS4):Eu2+ including, for example, SrGa2S4:Eu2+; Sr1-xBaxSiO4:Eu2+; or (Ca1-xSrx)S:Eu2+ wherein 0<x<1 including, for example, CaS: Eu2+ and SrS:Eu2+.

Examples of suitable yellow/green emitting phosphors may include Lu3-x-yMyAl5-zAzO12:Cex where M=Y, Gd, Tb, Pr, Sm, Dy; A=Ga, Sc and (0<x≤0.2); Ca3-x-yMySc2-zAzSi3O12:Cex where M=Y, Lu; A=Mg, Ga and (0<x≤0.2); Ba2-x-yMySiO4:Eux where M=Sr, Ca, Mg and (0<x≤0.2); Ba2-x-y-zMyKzSi1-zPzO4Eux where M=Sr, Ca, Mg and (0<x≤0.2); Sr1-x-yMyAl2-zSizO4-zNz:Eux where M=Ba, Ca, Mg and (0<x≤0.2); M1-xSi2O2N2:Eux where M=Sr, Ba, Ca, Mg and (0<x≤0.2); M3-xSi6O9N4:Eux where M=Sr, Ba, Ca, Mg and (0<x≤0.2); M3-xSi6O12N2:Eux where M=Sr, Ba, Ca, Mg and (0<x≤0.2); Sr1-x-yMyGa2-zAlzS4:Eux where M=Ba, Ca, Mg and (0<x≤0.2); Ca1-x-y-zMzS:CexAy where M=Ba, Sr, Mg; A=K, Na, Li and (0<x≤0.2); Sr1-x-zMzAl1+ySi4.2-yN7-yO0.4+y:Eux where M=Ba, Ca, Mg and (0<x≤0.2); Ca1-x-y-zMySc2O4:CexAz where M=Ba, Sr, Mg; A=K, Na, Li and (0<x≤0.2); Mx-zSi6- y-2xAly+2xOyN8-y:Euz where M=Ca, Sr, Mg and ($0<x\le0.2$); and Ca8-x-yMyMgSiO4Cl2:Eux where M=Sr, Ba and ($0<x\le0.2$).

Examples of suitable red emitting phosphor particles include Ca1-x-zMzS:Eux where M=Ba, Sr, Mg, Mn and ($0<x\le0.2$); Ca1-x-yMySi1-zAl1+zN3-zOz:Eux where M=Sr, Mg, Ce, Mn and ($0<x\le0.2$); Mg4Ge1-xO5F:Mnx where ($0<x\le0.2$); M2-xSi5-yAlyN8-yOy:Eux where M=Ba, Sr, Ca, Mg, Mn and ($0<x\le0.2$); Sr1-x-yMySi4-zAl1+zN7-zOz:Eux where M=Ba, Ca, Mg, Mn and ($0<x\le0.2$); and Ca1-x-yMySiN2:Eux where M=Ba, Sr, Mg, Mn and ($0<x\le0.2$).

In certain arrangements, a phosphor may include portions with inert particles rather than phosphor, with phosphor crystals without activating dopant, or the like such that those portions do not absorb and emit light. For example, SiNx may be included as inert particles. An activating dopant in the ceramic phosphor may also be graded, for example such that the phosphor particles closest to a surface have the highest dopant concentration. As the distance from the surface increases, the dopant concentration in the phosphor may decrease. The dopant profile may take any shape such as linear, step-graded, a power law profile, or the like and may include multiple, varying, or mixed dopant concentration.

In certain arrangements, portions of the substrate may be substantially without a phosphor or a dopant. The phosphor thickness and loading of activating dopant may be tailored to produce a desired emission wavelength(s) or spectrum. A phosphor may include multiple types of phosphor particles, each emitting the same or different wavelengths of light. Multiple types of phosphor particles may be mixed or formed into a single homogenous phosphor. Multiple types of phosphor particles may also be formed in separate layers that make up a stack or plurality of phosphor layers within the substrate 1102. Multiple substrate layers may also be bonded together to form a multilayer stack. Wavelength converting layer 1100 may also be used in conjunction with conventional phosphor layers, such as conformal phosphor layers or phosphor particles disposed in epoxy.

The wavelength converting layer 1100 may include various types of LEDs. Unconverted light emitted by the LED may be part of the resulting spectrum or wavelength(s) of extracted light. LEDs may be combined. Combinations may include a blue-emitting LED combined with a yellow-emitting wavelength converting particles, a blue-emitting LED combined with green- and red-emitting wavelength converting particles, a UV-emitting LED combined with blue- and yellow-emitting wavelength converting particles, a UV-emitting LED combined with blue-, green-, and red-emitting wavelength converting particles, or the like. Wavelength converting particles emitting other colors of light may be utilized to result in a desired extracted spectrum or wavelength(s) of light from a structure.

Binders may be used for holding together or attaching wavelength converting particles 1104 to a substrate 1102. Binders may be organic, inorganic, organic and inorganic, or the like. Organic binders may be acrylate, nitrocellulose, or the like. An organic/inorganic binder may be silicone such methyl or phenyl silicone, fluorosilicones, a high refractive index silicones, or the like to meet any pre-determine criteria. Inorganic binders may be a sol-gel, a sol-gel of TEOS, a sol-gel or MTMS, liquid glass, sodium silicate, potassium silicate, water glass, a material with a low viscosity that is able to saturate porous substrates, or the like.

Binders may also include fillers to adjust physical or optical properties. Fillers may include inorganic nanoparticles, silica, glass particles, fibers, materials that increase refractive index, or the like. Fillers may also include materials that increase optical performance, materials that promote scattering, materials that increase thermal performance, materials that increase brightness, or the like.

The wavelength converting layer 1100 of FIG. 1A may be substantially square, rectangular, polygonal, hexagonal, circular, or any other suitable or suitable shape. In certain arrangements, wavelength converting layer 1100 may be singulated before positioning near an LED. In certain arrangements, wavelength converting layer 1100 may be singulated after attachment to an LED. Wavelength converting layer 1100 may be directly attached to an LED, disposed in proximity to an LED, or the like. Wavelength converting layer 1100 may be separated from an LED by an inorganic layer, a polymer sheet, a thick adhesive layer, a small air gap, or any other suitable structure. The spacing between LED and the wavelength converting layer 1100 may be less than 500 μm, less than a nanometer, on the order of millimeters, or the like.

Multiple types of wavelength converting structures may be used in a device. A silicon and glass mesh wavelength converting layer may be combined with a molded polymer and quantum dot containing a wavelength converting layer. In addition, a filter or metallic reflector may be formed over at least a part of wavelength converting layer 1100. A filter may recycle parts of the spectrum or wavelength(s) emitted by the wavelength converting layers that are absorbed by other filter layers or differentially reflective structures. Filters may be a stack of dielectric layers that form a distributed Bragg reflector. In wavelength converting layer 1100, metallic reflectors may be used to recycle light that escapes through a sidewall.

In a certain arrangement, a device with two wavelength converting materials may emit light having a blue peak wavelength, a green peak wavelength, and a red peak wavelength. This arrangement may allow reflected light having a peak wavelength between the green and blue peak wavelengths, between the green and red peak wavelengths, or both.

Figure 1B:
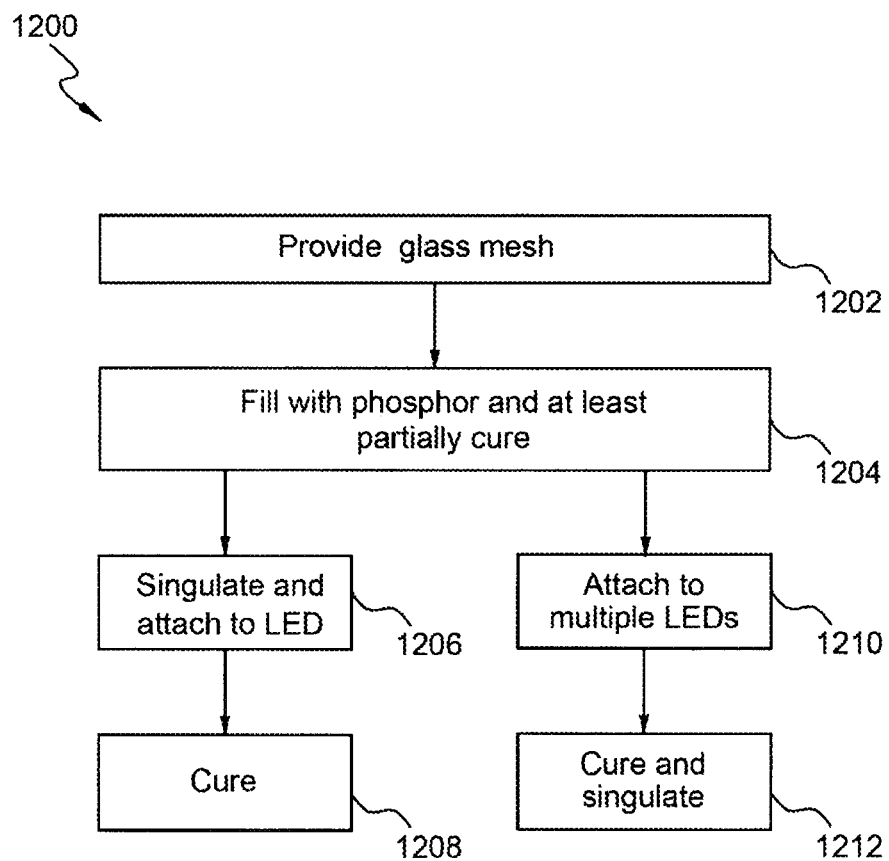
FIG. 1B illustrates a process to form a wavelength converting layer comprising a glass mesh.

FIG. 1B illustrates a process 1200 to form a wavelength converting layer comprising a glass mesh. It will be understood that although the disclosure herein may recite a glass mesh as an example, the mesh may be an applicable material such as glass, quartz, silicone, or the like. In 1200, a glass or silicon glass mesh may be provided (1202). The glass mesh may be built from multiple layers of glass threads or fibers that are arranged in a two or three-dimensional pattern and heated until partially, substantially, or the like fused. Sufficient spacing between glass fibers may be arranged so that a continuous open pore space exists in the three-dimensional structure. The glass mesh may be filled with a phosphor or binder slurry (1204). The phosphor or binder slurry may comprise inorganic or other fillers. Filling can be completed by dipping into a slurry at normal atmospheric pressure, by high pressure injections, by low pressure enabled fill, or the like. The phosphor or binder slurry may also include silicone that is heated or UV irradiated until partially, substantially, or the like cured. A binder slurry may also be spray coated over the mesh to create a thin or densely packed phosphor layers on both sides of a mesh.

A combined glass mesh substrate and phosphor or binder may be singulated and attached or positioned adjacent to an LED (1206). At or after curing (1208) contact positioning, adhesive attachment, structural positioning, or the like may be utilized to fix the combined glass mesh substrate and phosphor or binder to an LED. For attachment to multiple LEDS (1210), at or after curing (1212) may include contact positioning, adhesive attachment, structural positioning, or the like to fix the combined glass mesh substrate and phosphor or binder with respect to an LED. In addition, a structure may be singulated and separated prior to packaging.

Figure 1C:
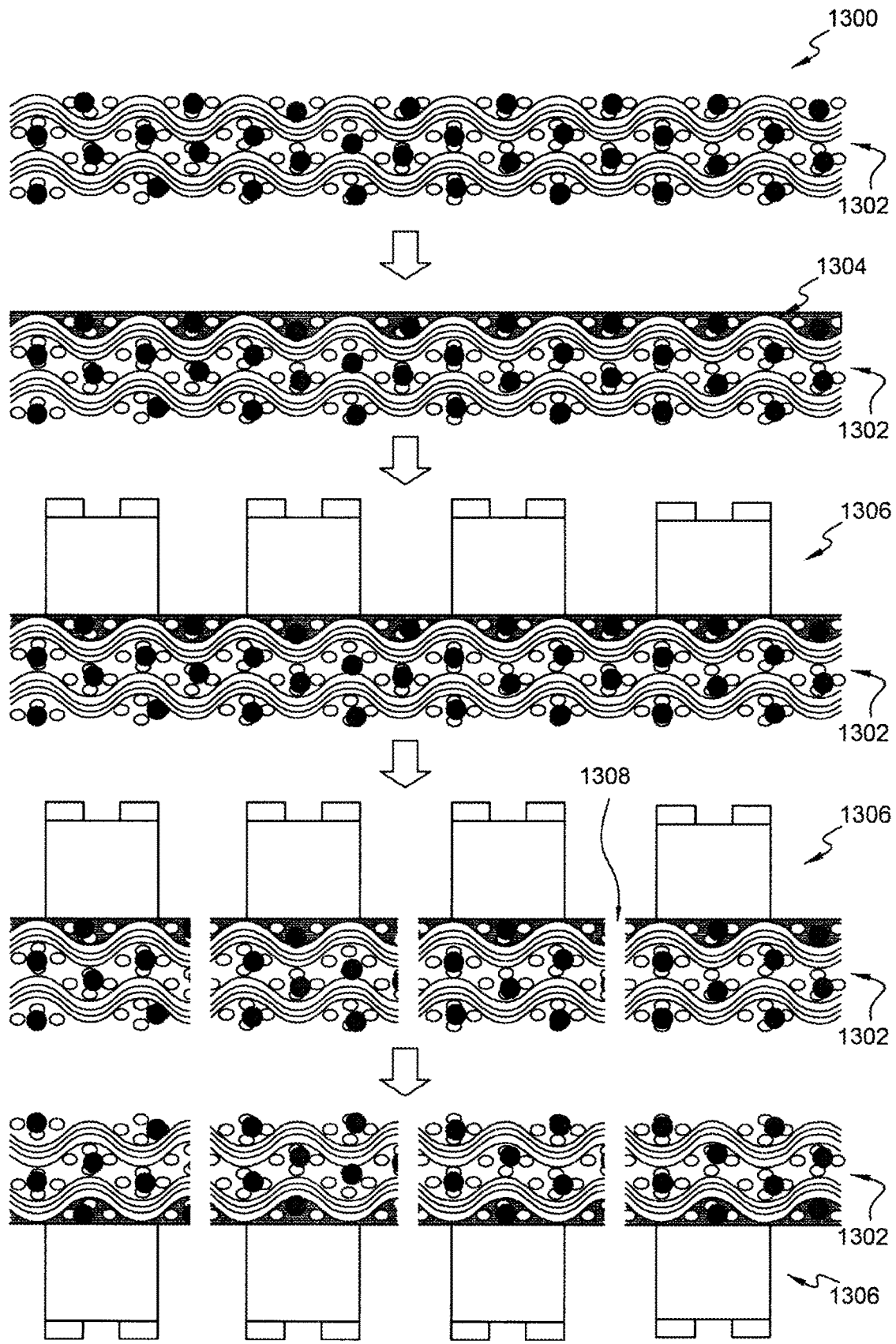
FIG. 1C illustrates a process to attach a glass silicone substrate wavelength converting layer to one or more lighting devices.

FIG. 1C illustrates a process 1300 to attach a glass silicone substrate wavelength converting layer to one or more lighting devices. A lighting device may be a LED or any other device capable at producing light. A glass or silicon glass mesh 1302 may be provided. An adhesive 1304 is then applied. An adhesive may be applied by spin coating, spin coating using the B-staged silicone, or the like to reduce adhesive or glue overflow or any other process, as desired. Glass or silicon mesh 1302 may then be attached, such as with the adhesive layer, to one or more singulated LEDs 1306. Mesh 1302 is singulated 1308. A combination of mesh 1302 and one or more singulated LEDs 1306 may also be inverted and readied for packaging.

Figure 1D:
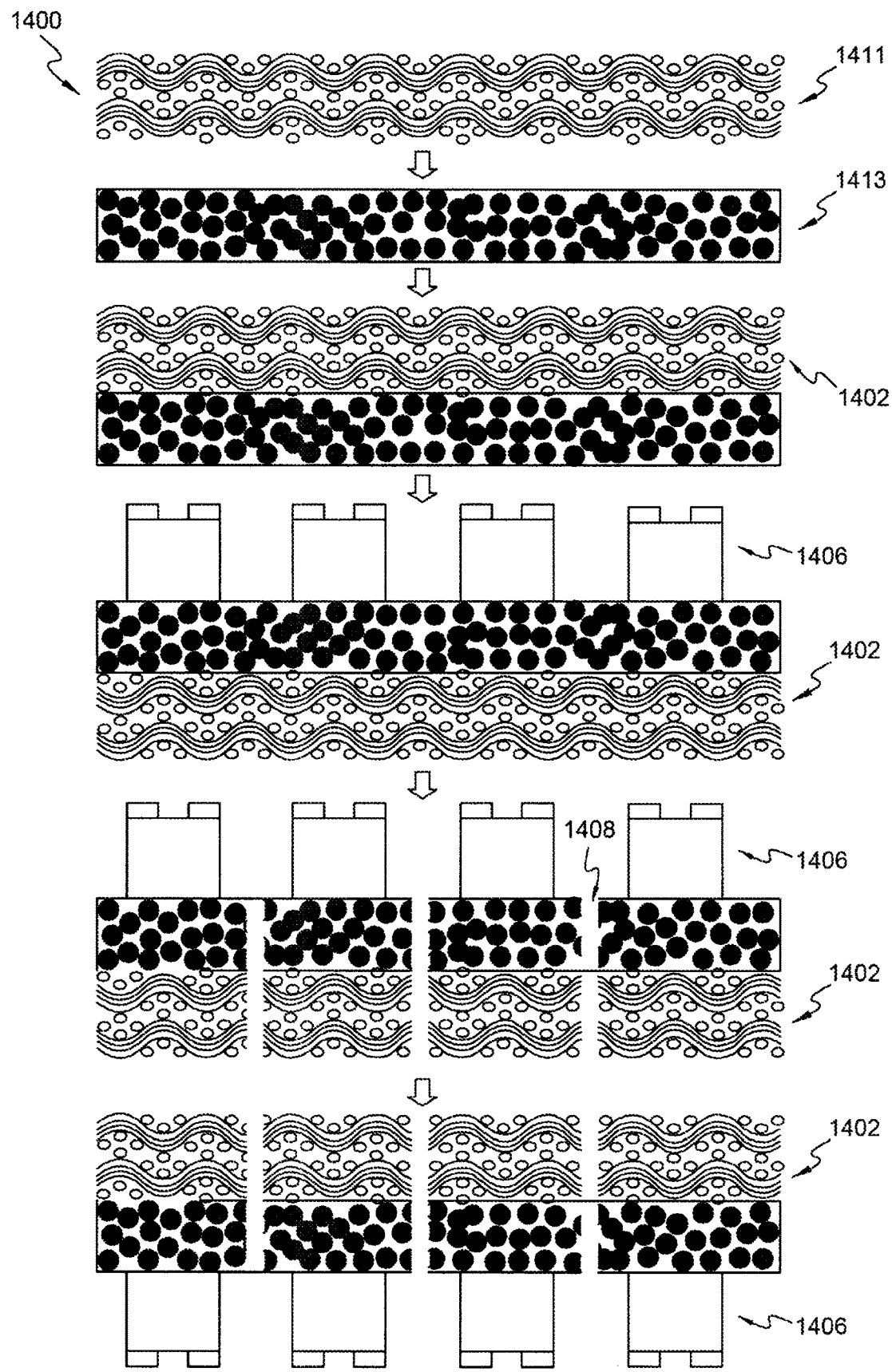
FIG. 1D illustrates a process to attach a laminated glass silicone substrate wavelength converting layer to one or more lighting devices.

FIG. 1D illustrates a process 1400 to attach a laminated glass silicone substrate wavelength converting layer to one or more lighting devices. A lighting device may be a LED or any other device capable at producing light. A glass or silicon glass mesh 1411 may be provided. A phosphor or binder 1413 may be pressure or heat laminated to glass or silicon glass mesh 1411. Phosphor or binder 1413 may provide structural support. The combined mesh 1402 and phosphor or binder 1413 may form a wavelength converting layer that is then attached, such as with an adhesive layer, to one or more LEDs 1406. The wavelength converting layer may be singulated 1408. A combination of the wavelength converting layer and one or more LEDs 1406 may also be inverted and readied for packaging.

Figure 1E:
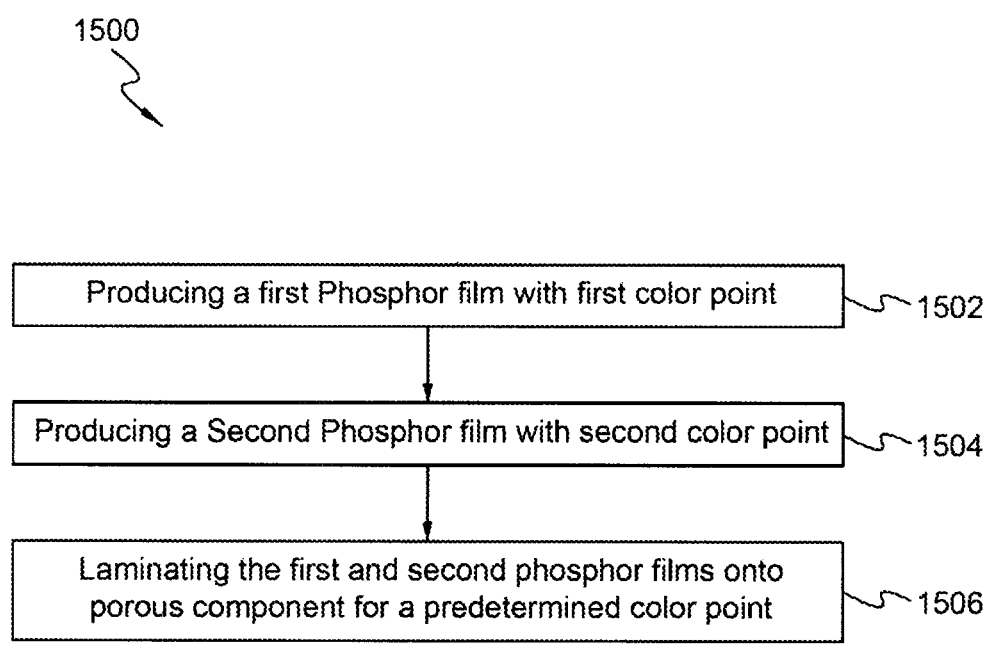
FIG. 1E illustrates a process to produce phosphor films with a porous component.

FIG. 1E illustrates a process 1500 to produce phosphor films with a porous component. A first converter film with first color point may be produced (1502) and a second converter film with second color point may be produced (1504). The first color point and the second color point may be such that, when the first converter film and the second converter film is laminated onto a porous component, the color point of the resulting wavelength converting layer is a pre-determined color point. The first and second phosphor films may be laminated onto a porous component, resulting in a wavelength converting layer with the predetermined color point (1506).

Figure 1F:
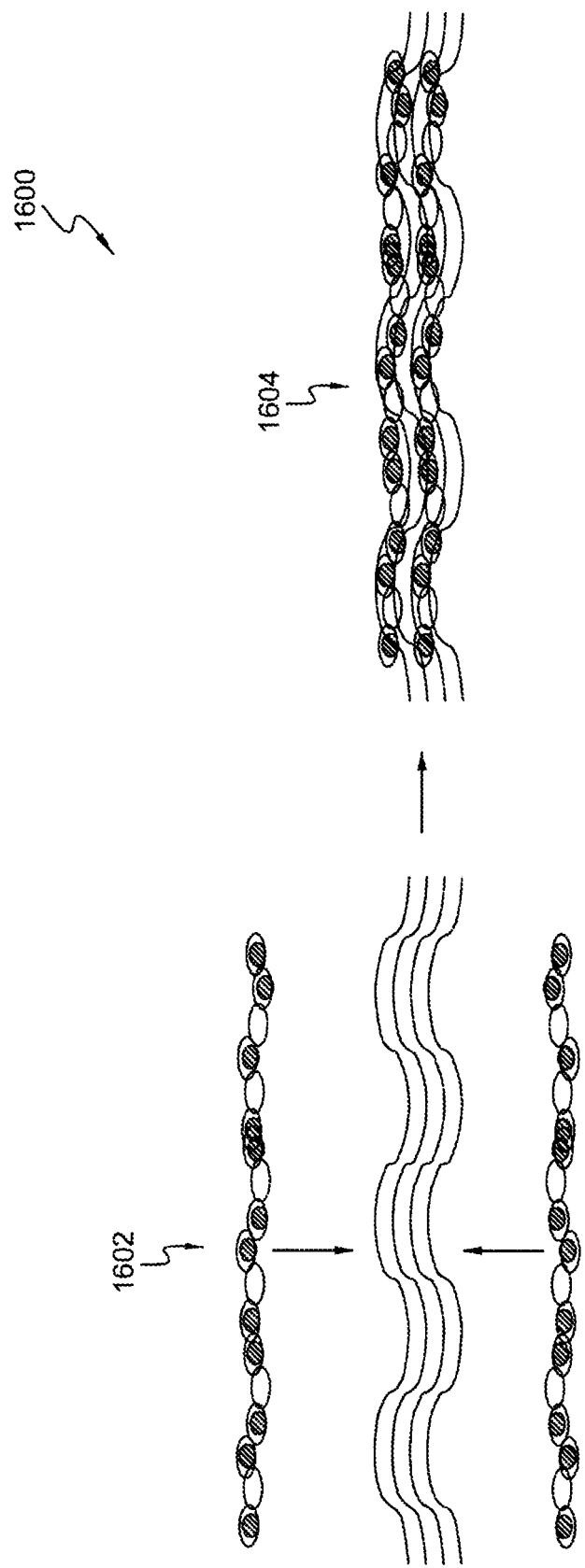
FIG. 1F illustrates manufacturing phosphor films with a porous component.

FIG. 1F illustrates a process 1600 for manufacturing wavelength converting film 1604 with a porous component. A first phosphor film with first color point and a second phosphor film with second color point may be laminated onto a porous component for a predetermined color point at 1602 resulting in wavelength converting layer 1604. The wavelength converting layer 1604 may correspond to the wavelength converting layer 206 of FIG. 2A, as further discussed herein.

Figure 2A:
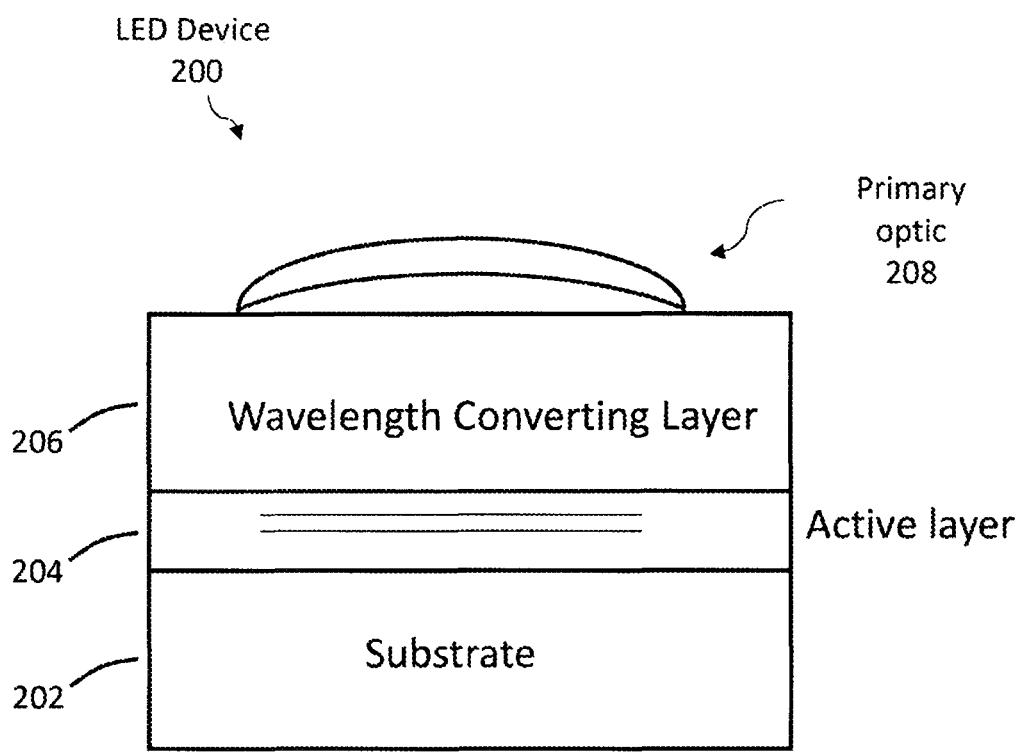
FIG. 2A is a diagram showing an light emitting diode (LED) device.

FIG. 2A is a diagram of an LED device 200 in an example embodiment. The LED device 200 may include a substrate 202, an active layer 204, a wavelength converting layer 206, and primary optic 208. In other embodiments, an LED device may not include a wavelength converting layer and/or primary optics.

As shown in FIG. 2A, the active layer 204 may be adjacent to the substrate 202 and emits light when excited. Suitable materials used to form the substrate 202 and the active layer 204 include sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof.

The wavelength converting layer 206 may be remote from, proximal to, or directly above active layer 204. The active layer 204 emits light into the wavelength converting layer 206. The wavelength converting layer 206 acts to further modify wavelength of the emitted light by the active layer 204. LED devices that include a wavelength converting layer are often referred to as phosphor converted LEDs (PCLED). The wavelength converting layer 206 may include any luminescent material, such as, for example, phosphor particles in a transparent or translucent binder or matrix, or a ceramic phosphor element, which absorbs light of one wavelength and emits light of a different wavelength. The wavelength converting layer 206 may have a pre-determined color point such that a first converter film with a first converter point and a second converter film with a second converter point are laminated onto a porous component, as disclosed herein, to manufacturer the wavelength converting layer 206 with the predetermined color point.

The primary optic 208 may be on or over one or more layers of the LED device 200 and allow light to pass from the active layer 204 and/or the wavelength converting layer 206 through the primary optic 208. The primary optic 208 may be a lens or encapsulate configured to protect the one or more layers and to, at least in part, shape the output of the LED device 200. Primary optic 208 may include transparent and/or semi-transparent material. In example embodiments, light via the primary optic may be emitted based on a Lambertian distribution pattern. It will be understood that one or more properties of the primary optic 208 may be modified to produce a light distribution pattern that is different than the Lambertian distribution pattern.

Figure 2B:
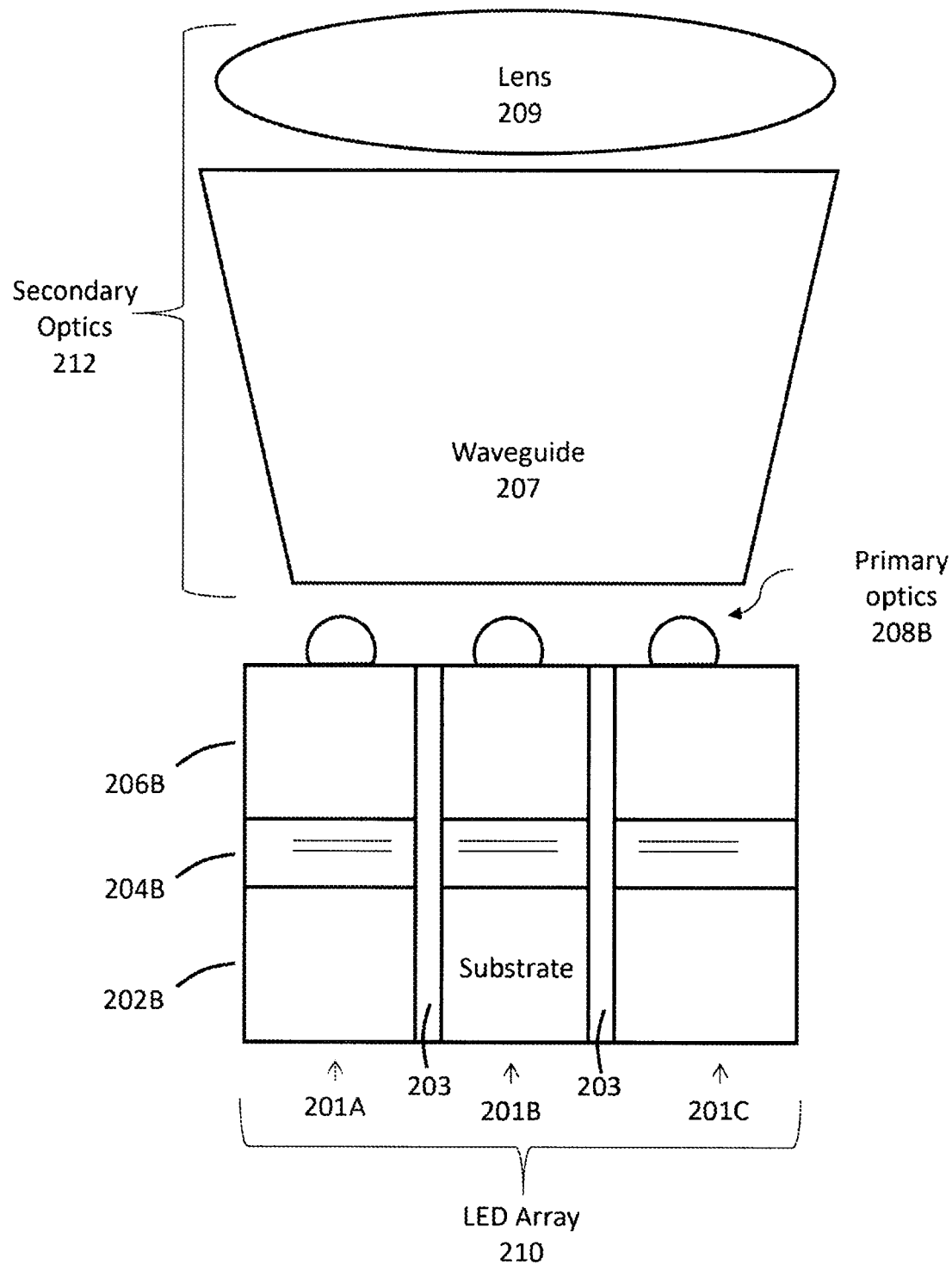
FIG. 2B is a diagram showing multiple LED devices.

FIG. 2B shows a cross-sectional view of a lighting system 220 including an LED array 210 with pixels 201A, 201B, and 201C, as well as secondary optics 212 in an example embodiment. The LED array 210 includes pixels 201A, 201B, and 201C each including a respective wavelength converting layer 206B active layer 204B and a substrate 202B. The LED array 210 may be a monolithic LED array manufactured using wafer level processing techniques, a micro LED with sub-500 micron dimensions, or the like. Pixels 201A, 201B, and 201C in the LED array 210 may be formed using array segmentation, or alternatively using pick and place techniques.

The spaces 203 shown between one or more pixels 201A, 201B, and 201C of the LED devices 200B may include an air gap or may be filled by a material such as a metal material which may be a contact (e.g., n-contact).

The secondary optics 212 may include one or both of the lens 209 and waveguide 207. It will be understood that although secondary optics are discussed in accordance with the example shown, in example embodiments, the secondary optics 212 may be used to spread the incoming light (diverging optics), or to gather incoming light into a collimated beam (collimating optics). In example embodiments, the waveguide 207 may be a concentrator and may have any applicable shape to concentrate light such as a parabolic shape, cone shape, beveled shape, or the like. The waveguide 207 may be coated with a dielectric material, a metallization layer, or the like used to reflect or redirect incident light. In alternative embodiments, a lighting system may not include one or more of the following: the wavelength converting layer 206B, the primary optics 208B, the waveguide 207 and the lens 209.

Lens 209 may be formed form any applicable transparent material such as, but not limited to SiC, aluminum oxide, diamond, or the like or a combination thereof. Lens 209 may be used to modify the a beam of light input into the lens 209 such that an output beam from the lens 209 will efficiently meet a desired photometric specification. Additionally, lens 209 may serve one or more aesthetic purpose, such as by determining a lit and/or unlit appearance of the p 201A, 201B and/or 201C of the LED array 210.

Figure 3:
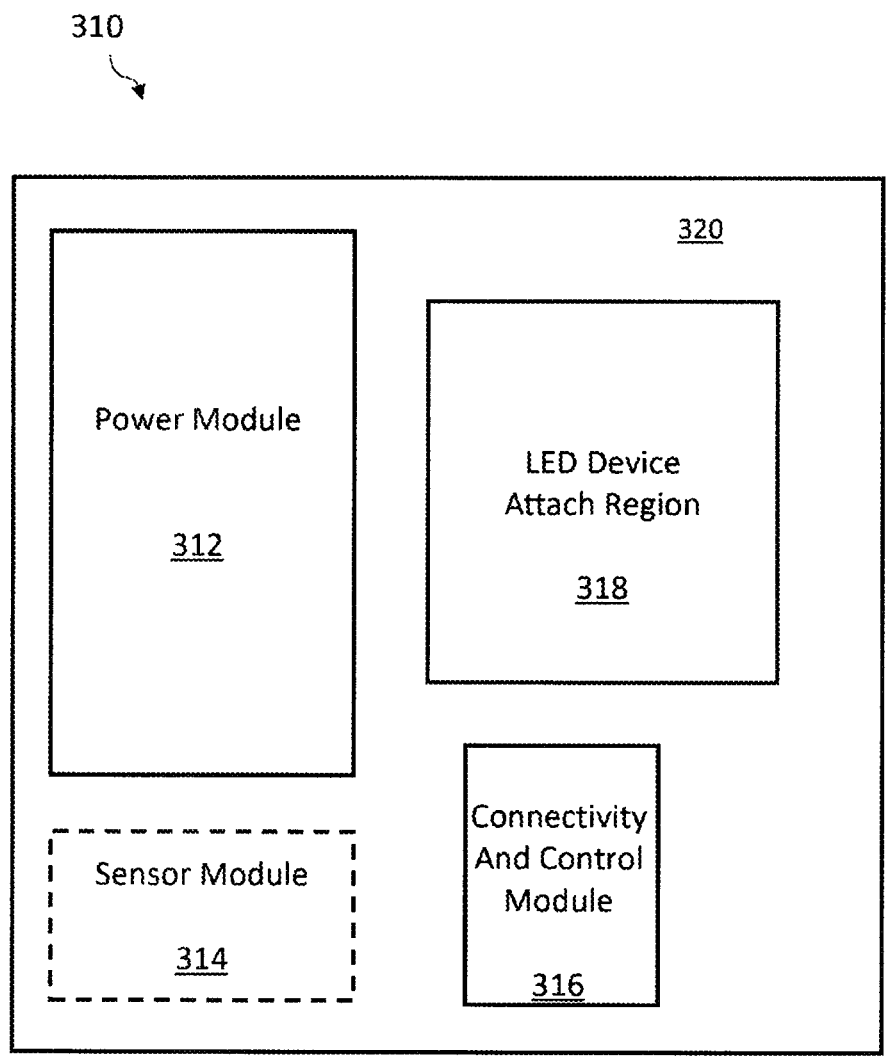
FIG. 3 is a top view of an electronics board for an integrated LED system according.

FIG. 3 is a top view of an electronics board 310 for an integrated LED lighting system according to one embodiment. In alternative embodiments, two or more electronics boards may be used for the LED lighting system. For example, the LED array may be on a separate electronics board, or the sensor module may be on a separate electronics board. In the illustrated example, the electronics board 310 includes a power module 312, a sensor module 314, a connectivity and control module 316 and an LED attach region 318 reserved for attachment of an LED array to a substrate 320.

The substrate 320 may be any board capable of mechanically supporting, and providing electrical coupling to, electrical components, electronic components and/or electronic modules using conductive connecters, such as tracks, traces, pads, vias, and/or wires. The power module 312 may include electrical and/or electronic elements. In an example embodiment, the power module 312 includes an AC/DC conversion circuit, a DC/DC conversion circuit, a dimming circuit, and an LED driver circuit.

The sensor module 314 may include sensors needed for an application in which the LED array is to be implemented.

The connectivity and control module 316 may include the system microcontroller and any type of wired or wireless module configured to receive a control input from an external device.

The term module, as used herein, may refer to electrical and/or electronic components disposed on individual circuit boards that may be soldered to one or more electronics boards 310. The term module may, however, also refer to electrical and/or electronic components that provide similar functionality, but which may be individually soldered to one or more circuit boards in a same region or in different regions.

Figure 4A:
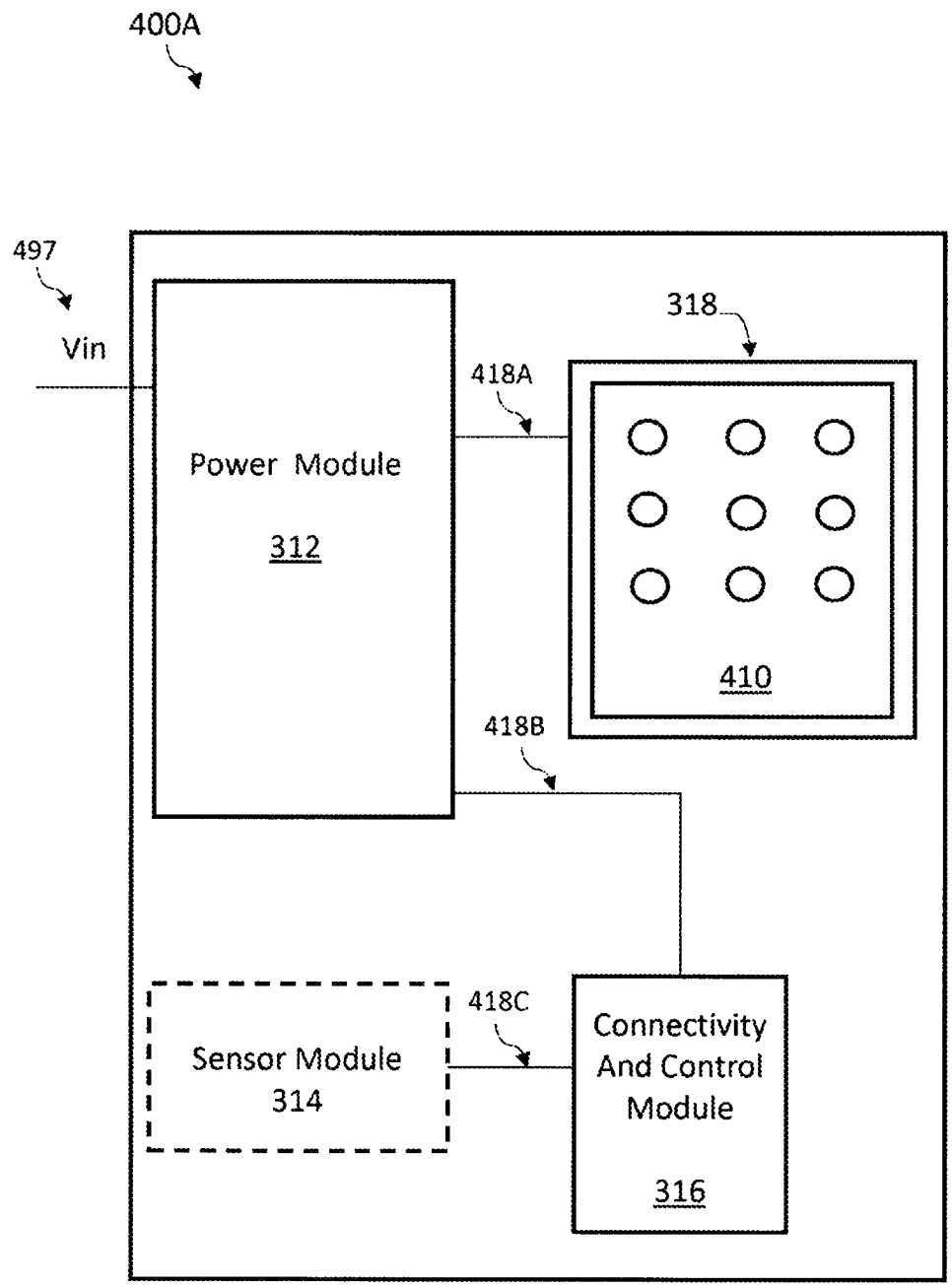
FIG. 4A is a top view of the electronics board with an LED array attached to the substrate at the LED device attach region.

FIG. 4A is a top view of the electronics board 310 with an LED array 410 attached to the substrate 320 at the LED device attach region 318 in one embodiment. The electronics board 310 together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 4A, the connectivity and control module 316 receives sensor signals from the sensor module 314 over trace 418C.

Figure 4B:
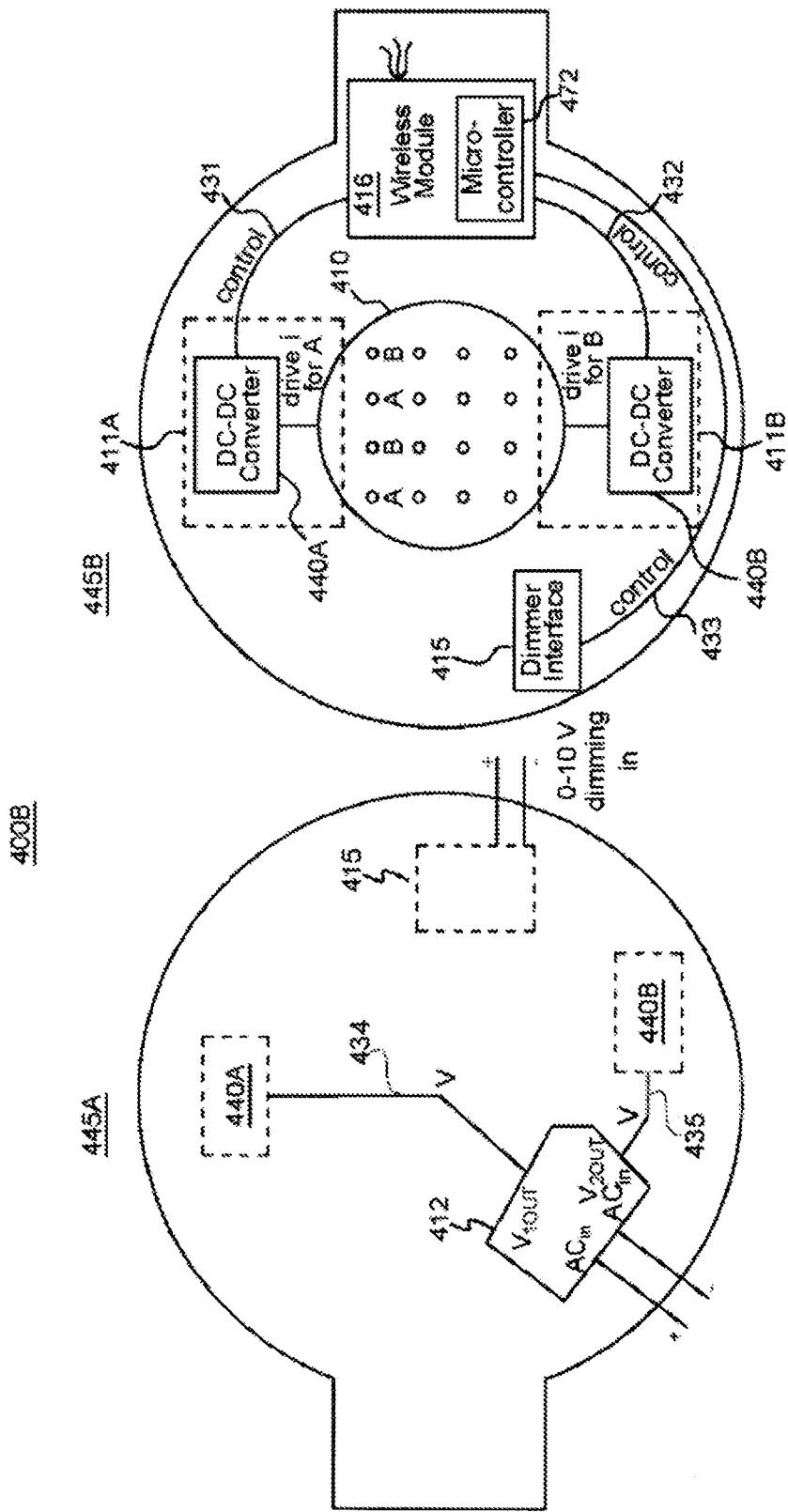
FIG. 4B is a diagram of a two channel integrated LED lighting system with electronic components mounted on two surfaces of a circuit board.

FIG. 4B illustrates one embodiment of a two channel integrated LED lighting system with electronic components mounted on two surfaces of a circuit board 499. As shown in FIG. 4B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it.

The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411 A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 4B does not include a sensor module (as described in FIG. 3 and FIG. 4A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or subsurface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 5:
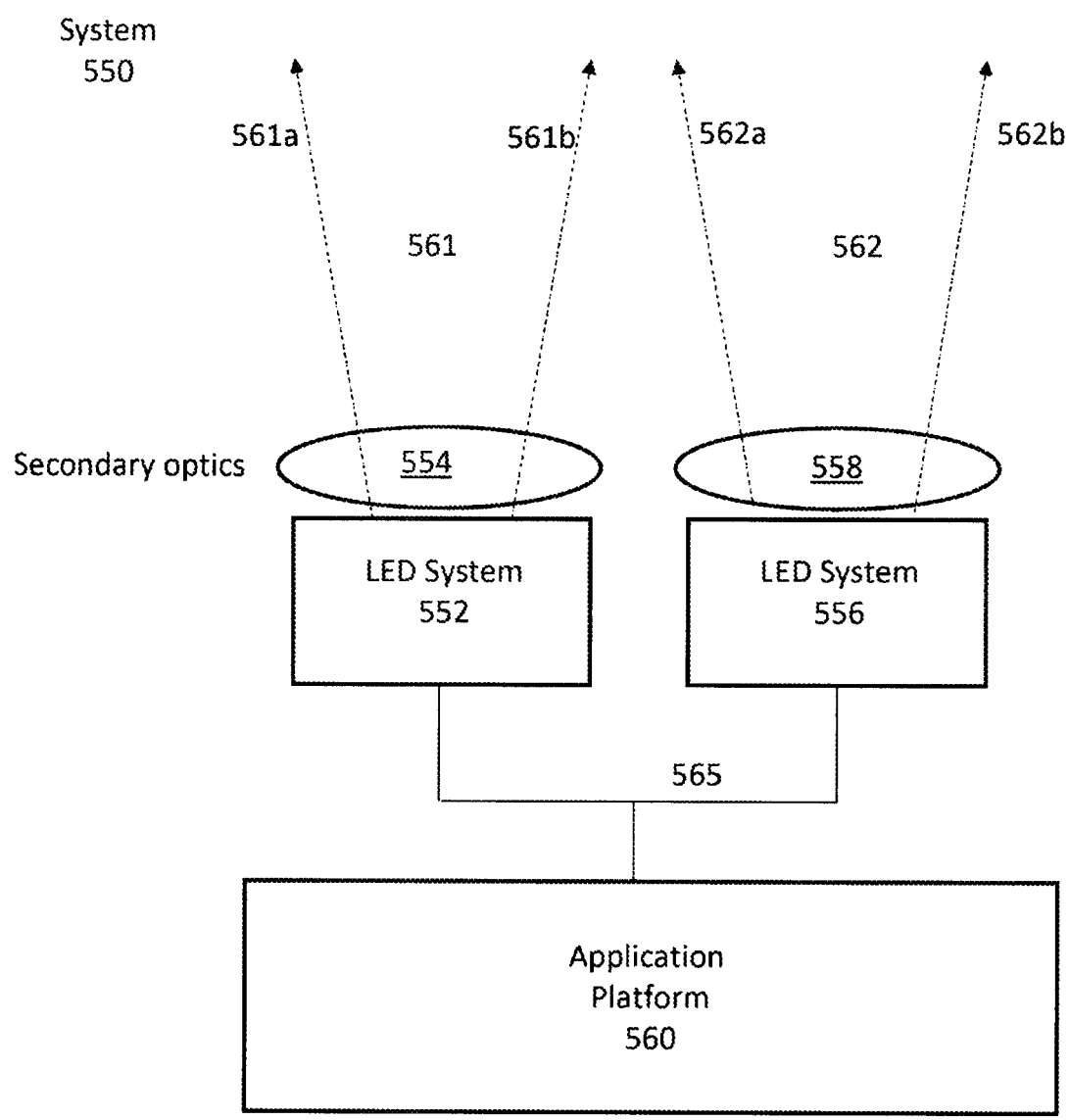
FIG. 5 is a diagram of an example application system.

FIG. 5 shows an example system 550 which includes an application platform 560, LED systems 552 and 556, and secondary optics 554 and 558. The LED System 552 produces light beams 561 shown between arrows 561a and 561b. The LED System 556 may produce light beams 562 between arrows 562a and 562b. In the embodiment shown in FIG. 5, the light emitted from LED system 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, augmented reality (AR)/virtual reality (VR) devices, and robotic devices. The integrated LED lighting system shown in FIG. 3, LED System 400A shown in FIG. 4A, illustrate LED systems 552 and 556 in example embodiments.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 4A and LED System 400B shown in FIG. 4B illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a VCSEL. The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A wavelength converting layer comprising:
a porous support structure including one or more quartz or glass mesh layers; and
a cured layer of wavelength converting particles and a binder laminated onto the porous support structure,
all or at least a portion of the thickness of the porous support structure lacking any of the wavelength converting particles, and
all or at least a portion of the thickness of the cured layer lacking any fibers or strings of the one or more mesh layers.

2. The wavelength converting layer of claim 1, wherein the binder includes a silicone.

3. The wavelength converting layer of claim 1, wherein the one or more mesh layers include woven support material.

4. The wavelength converting layer of claim 3, wherein a first woven support material includes the fibers or strings, and the fibers or strings extend across substantially 100% of a transverse dimension of the one or more mesh layers.

5. The wavelength converting layer of claim 1, wherein the binder includes one or more fillers configured to increase a refractive index.

6. The wavelength converting layer of claim 1, wherein the wavelength converting particles include phosphor particles or pre-formed ceramic phosphor.

7. A light emitting device comprising:
a wavelength converting layer, and
a semiconductor active layer,
the wavelength converting layer including a porous support structure including one or more quartz or glass mesh layers, and a cured layer of wavelength converting particles and a binder laminated onto the porous support structure,
all or at least a portion of the thickness of the porous support structure lacking any of the wavelength converting particles,
all or at least a portion of the thickness of the cured layer lacking any fibers or strings of the one or more mesh layers, and
the wavelength converting layer being positioned and arranged to absorb first light emitted from the active layer at a first wavelength, and to emit second light at a second wavelength different from the first wavelength.

8. The light emitting device of claim 7, wherein the binder includes a silicone.

9. The light emitting device of claim 7, wherein the one or more mesh layers include woven support material.

10. The light emitting device of claim 9, wherein a first woven support material includes the fibers or strings, and the fibers or strings extend across substantially 100% of a transverse dimension of the one or more mesh layers.

11. The light emitting device of claim 7, wherein the binder includes one or more fillers configured to increase a refractive index.

12. The light emitting device of claim 7, wherein the wavelength converting particles include phosphor particles or pre-formed ceramic phosphor.

13. A method comprising:
forming a porous support structure that includes one or more quartz or glass mesh layers;
forming a layer that includes wavelength converting particles and a binder; and
heat or pressure laminating the layer of the wavelength converting particles and the binder onto the porous support structure to form a laminated wavelength converting layer, so that all or at least a portion of the thickness of the porous support structure lacks any of the wavelength converting particles, and so that all or at least a portion of the thickness of the layer of the wavelength converting particles and the binder lacks any fibers or strings of the one or more mesh layers.

14. The method of claim 13 wherein the wavelength converting particles and the binder are characterized by a first color point, the method further comprising:
forming a layer that includes second wavelength converting particles and a second binder, wherein the second wavelength converting particles and the second binder are characterized by a second color point that differs from the first color point; and
heat or pressure laminating the layer of the second wavelength converting particles and the second binder onto the porous support structure of the wavelength converting layer, so that (i) the wavelength converting layer exhibits a predetermined color point, (ii) all or at least a portion of the thickness of the porous support structure lacks any of the second wavelength converting particles, and (iii) all or at least a portion of the thickness of the layer of the second wavelength converting particles and the second binder lacks any fibers or strings of the one or more mesh layers.

15. The method of claim 13 further comprising attaching multiple semiconductor light emitting devices to corresponding portions of the layer of the wavelength converting particles and the binder of the laminated wavelength converting layer, each portion of the laminated wavelength converting layer being positioned and arranged to absorb first light emitted by an active layer of the corresponding attached light emitting device at a first wavelength, and to emit second light at a second wavelength different from the first wavelength.

16. The method of claim 15 further comprising:
before attaching the light emitting devices, singulating the laminated wavelength converting layer, and
positioning each light emitting device against a corresponding singulated portion of the laminated wavelength converting layer.

17. The method of claim 15 further comprising, after attaching the light emitting devices, singulating the laminated wavelength converting layer so that each light emitting device is attached to a corresponding singulated portion of the laminated wavelength converting layer.

18. The method of claim 13 wherein the binder includes a silicone, or the wavelength converting particles include phosphor particles or pre-formed ceramic phosphor.

19. The method of claim 13 wherein the stacked one or more mesh layers include woven support material.

20. The method of claim 13, wherein the binder includes one or more fillers to increase a refractive index.

* * * * *

UNITED STATES PATENT AND TRADEMARK OFFICE
CERTIFICATE OF CORRECTION

Page 1 of 1

PATENT NO. : 11,973,168 B2
APPLICATION NO. : 18/122520
DATED : April 30, 2024
INVENTOR(S) : Grigoriy Basin et al.

It is certified that error appears in the above-identified patent and that said Letters Patent is hereby corrected as shown below:

In the Claims

In Claim 19 1st Line; Column 14 Line 32; delete "stacked"

Signed and Sealed this
Twenty-sixth Day of August, 2025

Coke Morgan Stewart
*Acting Director of the United States Patent and Trademark Office*